United States Patent [19]

Kim et al.

[11] Patent Number: 5,302,233
[45] Date of Patent: Apr. 12, 1994

[54] METHOD FOR SHAPING FEATURES OF A SEMICONDUCTOR STRUCTURE USING CHEMICAL MECHANICAL PLANARIZATION (CMP)

[75] Inventors: Sung C. Kim; Scott Meikle, both of Boise, Id.

[73] Assignee: Micron Semiconductor, Inc., Boise, Id.

[21] Appl. No.: 34,421

[22] Filed: Mar. 19, 1993

[51] Int. Cl.$^5$ .................................... H01L 21/461
[52] U.S. Cl. .................................... 156/636; 156/662; 437/228; 437/249; 51/281 R; 51/283 R
[58] Field of Search ............... 156/636, 662; 437/228, 437/249; 51/283 R, 281 R

[56] References Cited

U.S. PATENT DOCUMENTS

| | | | |
|---|---|---|---|
| 3,841,031 | 10/1974 | Walsh | 51/283 |
| 4,758,531 | 7/1988 | Beyer et al. | 437/90 |
| 5,036,015 | 7/1991 | Sandhu et al. | 437/8 |
| 5,036,630 | 8/1991 | Kaanta et al. | 51/283 R |
| 5,137,597 | 8/1992 | Curry, II et al. | 156/636 |
| 5,142,828 | 9/1992 | Curry, II | 51/281 R |
| 5,230,184 | 7/1993 | Bukhman | 51/283 R |

FOREIGN PATENT DOCUMENTS 4-242929 8/1992 Japan .

OTHER PUBLICATIONS

H. Vora, Study of Mechano-Chemical Machining of Ceramics and the Effect of Thin Film Behavior, Honeywell, Feb. 1984, pp. 1-48.
W. L. C. M. Heyboer et al., "Chemomechanical Silicon Polishing", *J. Electrochem. Soc.*, vol. 138, No. 3, Mar. 1991, pp. 774-777.
S. Wolf, *Silicon Processing for the VLSI Era*, vol. 2, Lattice Press, Sunset Beach, Calif. 1990, pp. 199-201, 232-239.

*Primary Examiner*—Brian E. Hearn
*Assistant Examiner*—Laura M. Holtzman
*Attorney, Agent, or Firm*—Stephen A. Gratton

[57] ABSTRACT

In semiconductor manufacture a method of shaping the features of a semiconductor structure using chemical mechanical planarization (CMP) is provided. During CMP, a relatively soft polishing pad is utilized to conform to and contour a topography of the semiconductor structure. Another layer of a material such as a dielectric (e.g. TEOS based silicon dioxide) can then be deposited over the contoured topography without the inclusion of voids. The method of the invention is particularly suited to the formation of void free dielectric layers.

18 Claims, 3 Drawing Sheets

METHOD FOR SHAPING FEATURES OF A SEMICONDUCTOR STRUCTURE USING CHEMICAL MECHANICAL PLANARIZATION (CMP)

FIELD OF THE INVENTION

This invention relates to semiconductor manufacture and more particularly to a method for shaping the features of a semiconductor structure using chemical mechanical planarization (CMP). The method of the invention is especially suited to the formation of void-free interlevel dielectric layers in a semiconductor structure.

BACKGROUND OF THE INVENTION

In microchip fabrication, integrated circuits are formed on a semiconducting substrate. In general, various materials which are either conductive, insulating, or semiconducting are utilized to form the integrated circuits. These materials are patterned, doped with impurities, and deposited by various processes to form the integrated circuits. Active devices (e.g. transistors, diodes, etc.) formed on the substrate are interconnected utilizing metal lines embedded in a dielectric layer.

As silicon technology advances to ultra large scale integration (ULSI), the devices on silicon wafers shrink to sub-micron dimension and the circuit density increases to several million transistors per die. In order to accomplish this high device packing density, smaller and smaller feature sizes are required. This may include the geometry of various features and the width and spacing of the interconnecting lines.

These diminishing geometries have necessitated improved deposition and patterning techniques during the manufacture of semiconductor devices. As an example, dielectric layers formed over interlevel conducting lines are typically planarized to minimize topographic effects on subsequent photolithography processes. In a typical process, a dielectric layer is conformally deposited over patterned metal or semiconductor lines in such a way as to fill in the gaps between the lines. The dielectric deposition is followed by a planarization step such as chemical mechanical planarization (CMP), to remove excess material and planarize the surface topography.

In general, the chemical mechanical planarization (CMP) process involves holding a semiconductor substrate, such as a wafer, against a rotating wetted polishing pad under a controlled downward pressure. A polishing slurry, metered onto the polishing pad contains etchants and an abrasive material such as alumina or silica. A rotating polishing head or wafer carrier is typically utilized to hold the wafer under controlled pressure against the rotating polishing pad. The polishing pad is typically formed of a relatively soft wetted pad material such as a felt fiber fabric impregnated with blown polyurethane.

As patterned line widths become smaller, a conventional CMP process may not be entirely suitable for planarizing a dielectric layer of a semiconductor structure. As an example, the conformal deposition of a dielectric layer may not completely fill the gaps between conducting lines of a semiconductor structure. This may cause voids to be present in the completed dielectric layer. This situation is illustrated in FIGS. 1A and 1B.

With reference to FIG. 1A, a semiconductor structure includes a substrate 10 and an arrangement of patterned conducting lines 12. A dielectric layer 14 is being conformally deposited over the conducting lines 12 and into the gaps 16 between the conducting lines 12. As the deposition process is not perfectly conformal, however, the dielectric layer 14 bulges outwardly in the area 18 directly over the conducting lines. This phenomena is known as "breadloafing" or "cusping". The cusping effectively closes the mouth of the gaps 16 and increases the aspect ratio (depth/width) of the gaps 16. This makes filling of the gap with subsequently deposited dielectric material difficult. As the deposition process continues further, and as shown in FIG. 1B, voids 20 are formed in the dielectric layer 14.

These voids 20 are at a minimum, a cosmetic imperfection, which are not removed by the subsequent planarization process. More seriously, these voids 20 may be opened up during a subsequent planarization process (e.g. CMP) and adversely affect subsequent processing by outgassing or causing photo-notching during photo-patterning of the dielectric layer 14. Furthermore, even if the voids 20 are not opened during planarization, outgassing from the voids 20 over extended periods of time may degrade the long term reliability of the semiconductor structure.

In order to prevent the formation of voids in a dielectric layer, improved dielectric materials and deposition processes have recently been developed for semiconductor manufacture. In general, such improved deposition processes and materials allow a more conformal deposition of high quality dielectric layers so that cusping or breadloafing of the dielectric material over the conducting liner is minimized. As an example, ozone doped tetraethyl orthosilicate based (TEOS) dielectric films can be deposited with a high degree of conformality utilizing new gas chemistries. These new deposition processes however, have not entirely eliminated the formation of voids.

Multistep deposition processes have also been developed to provide a more conformal deposition of a dielectric layer. As an example, an initial deposition of a dielectric layer is sometimes followed by an etch step and then by a second deposition step. The purpose of the etch step is to shape the profile of the initially deposited dielectric layer in such a way that no voids will form as the deposition process is continued. Such an etch step is sometimes referred to as "facet etch" because facet-like surfaces are formed in the etched material.

FIGS. 2A-2C illustrate such a multi step deposition process. With reference to FIG. 2A, a dielectric layer 14 (e.g. 3000-5000 angstroms) is again being deposited over parallel spaced conducting lines 12 and into the gaps 16 of a semiconductor structure. Instead of continuing the deposition process, however, the deposition procedure is stopped before the gaps are completely filled and the dielectric layer 14 is etched using a facet etch procedure. This is shown in FIG. 2B. The facet etch step can be performed using a anisotropic chemical etch or a physical sputter etch.

As shown in FIG. 2B, the facet etch step removes the breadloaf area 18 (FIG. 2A) of the dielectric layer 14. In addition, the facet etch step removes some of the dielectric layer 14 on the sidewalls of the conducting lines such that the mouth of the gaps 16 is opened and the width "w" of the gaps 16 is increased. The aspect ratio (depth/width) of the gaps 16 is thus decreased. In addition, the facet etch step shapes and facets the profile of the dielectric layer 14 and removes the corners of the breadloaf area 18 (FIG. 2A) substantially as shown in FIG. 2B.

Following the facet etch step, the deposition process is continued to complete the dielectric layer 14. As shown in FIG. 2C, however, voids 20 may still form within the dielectric layer 14. As with the prior art single step deposition process, with the present state of facet etch technology, complete void removal is not possible in one step. A series of deposition/etch steps are thus required to completely remove the voids. This is a limitation of a prior art multistep deposition/etch/deposition process. In addition, such multistep processes are relatively expensive and time consuming and require additional process equipment (e.g. vacuum etching equipment).

As is apparent then, there is a need in the art for an improved method for forming dielectric layers without the inclusion of voids. More generally, there is a need in the art for improved methods for shaping the features of a semiconductor structure that can be accomplished without etching.

Accordingly, it is an object of the present invention to provide an improved method for shaping the features of a semiconductor structure. It is yet another object of the present invention to provide an improved method for forming a dielectric layer of a semiconductor structure without the inclusion of voids. It is yet another object of the present invention to provide an improved method for shaping the features of a semiconductor structure using chemical mechanical planarization (CMP), that is efficient, cost effective, and adaptable to large scale semiconductor manufacture.

SUMMARY OF THE INVENTION

In accordance with the present invention, an improved method for shaping the features of a semiconductor structure is provided. The method of the invention broadly stated, comprises the polishing of a semiconductor structure, at an appropriate phase of a semiconductor manufacturing process, utilizing a polishing pad selected to conform to and shape a desired feature of the semiconductor structure. A preferred method of polishing the semiconductor structure is using a chemical mechanical planarization apparatus. The method of the invention can be used to round or enhance existing features without the global planarity for which chemical mechanical planarization (CMP) has typically been utilized.

In an illustrative embodiment of the invention, the method of the invention is used in the formation of a void free dielectric layer for interlevel conducting lines of a semiconductor structure. Stated in more detail, for forming a void free dielectric layer, the method of the invention includes the steps of:

providing a semiconductor structure that includes a substrate and a plurality of conducting lines;

conformally depositing a dielectric material over the conducting lines and into the gaps between the conducting lines to form an initial (partial) dielectric layer;

contouring a profile of the initial dielectric layer by chemical mechanical planarization (CMP) using a polishing pad selected to conform to and shape the top surface and gaps of the dielectric layer to form a contoured dielectric layer;

continuing deposition of the dielectric material over the contoured dielectric layer to form a completed dielectric layer; and planarizing the completed dielectric layer using chemical mechanical planarization (CMP), or other suitable means, and further processing the semiconductor structure (e.g. photopatterning).

These and other objects, features and advantages of the invention will be apparent from the following more particular description of the preferred embodiments of the invention as illustrated in the accompanying drawing.

DETAILED DESCRIPTION OF THE PREFERRED EMBODIMENT

Figure 1A:
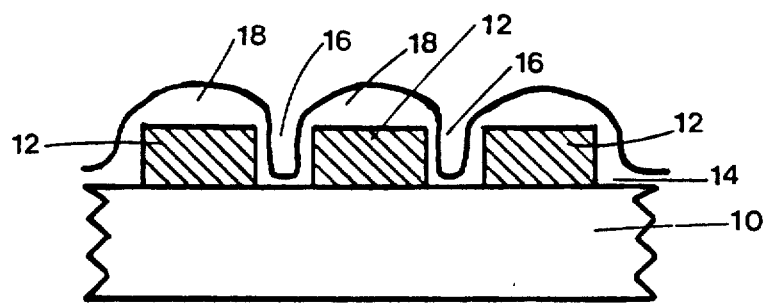
FIGS. 1A–1B are schematic cross sectional views of a semiconductor structure illustrating a prior art process sequence in the formation of a dielectric layer and showing the formation of voids in the dielectric layer.
Figure 1B:
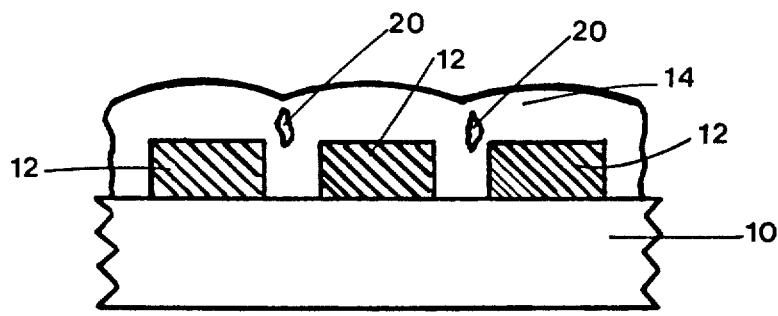
Figure 2A:
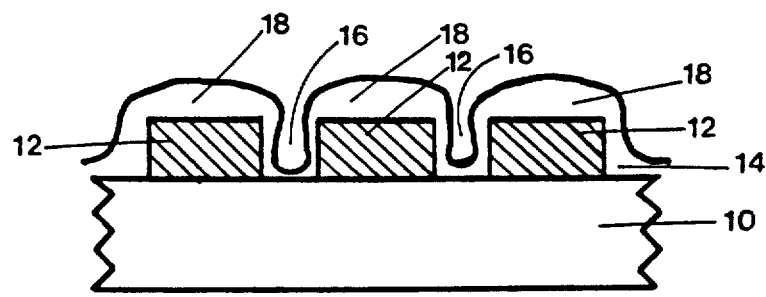
FIGS. 2A–2C are schematic cross sectional views of a semiconductor structure illustrating a prior art multistep deposition/etch/deposition process sequence for forming a dielectric layer and showing the formation of voids in the dielectric layer.
Figure 2B:
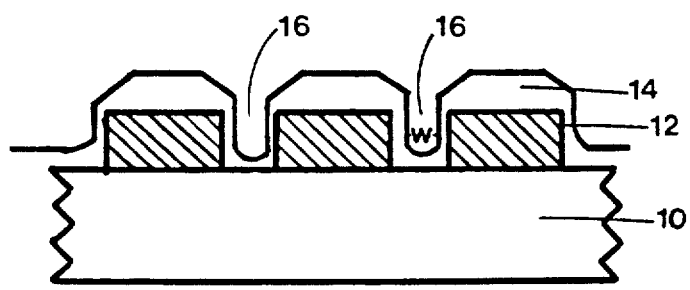
Figure 2C:
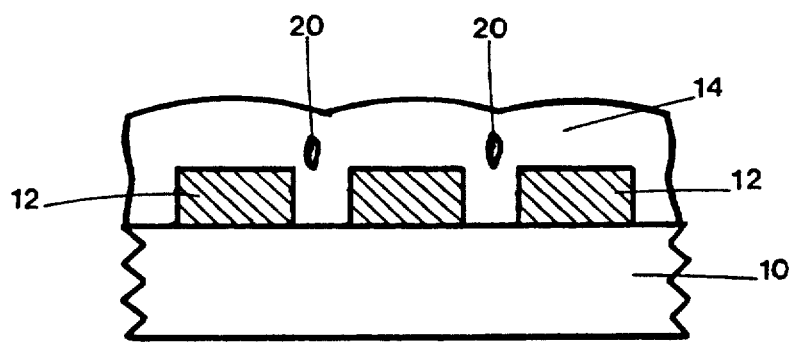
Figure 3A:
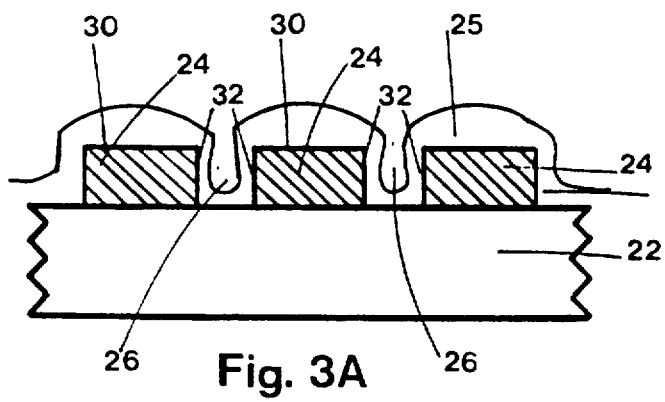
FIGS. 3A–3D are schematic cross sectional views of a semiconductor structure illustrating a process sequence for forming a dielectric layer without voids in accordance with the method of the present invention.

Referring now to FIGS. 3A–3D, an illustrative embodiment of the method of the invention is shown. As shown in FIG. 3A, a semiconductor structure is provided that includes a semiconducting substrate 22. As an example, the substrate 22 may be formed of a monocrystalline silicon (or gallium arsenide) wafer. The wafer includes a large number of individual dies fabricated with a variety of semiconductor devices (not shown). A plurality of parallel spaced conducting lines 24 have been formed on the substrate 22.

The conducting lines 24 may be inter-layer connections for connecting the semiconductor devices to one another and ultimately to bond pads for connection to the outside world. The conducting lines 24 may be formed of a conducting material such as a metal (e.g. copper, tungsten) or a semiconducting material (e.g. polysilicon). The conducting lines 24 may be deposited and patterned by techniques that are known in the art. The conducting lines 24 include a top surface 30 and generally vertical parallel sidewalls 32.

With such a semiconductor structure, it is necessary to isolate the conducting lines 24 from one another. This is typically accomplished using a dielectric material such as silicon dioxide, silicon nitride, TEOS based oxides or the like. For insulating the conducting lines 24, it is necessary to deposit dielectric material over the conducting lines 24 and into the gaps 26 between adjacent conducting lines 24 such that ultimately the conducting lines 24 are embedded in the dielectric material.

Initially, as shown in FIG. 3A, a dielectric material (e.g. 2000–6000 angstroms) is conformally deposited over the substrate 22 and in the gaps 26 between adjacent conducting lines 24 to form an initial dielectric layer 25. To form the initial dielectric layer 25, a suitable dielectric material such as TEOS based oxide may be deposited by a suitable deposition technique such as chemical vapor deposition (CVD). The initial dielectric layer 25 covers the top surface 30 and sidewalls 32 of the conducting lines 24. The initial dielectric layer 25, however, is deposited such that the gaps 26 between adjacent conducting lines 24 are not completely filled.

Figure 3B:
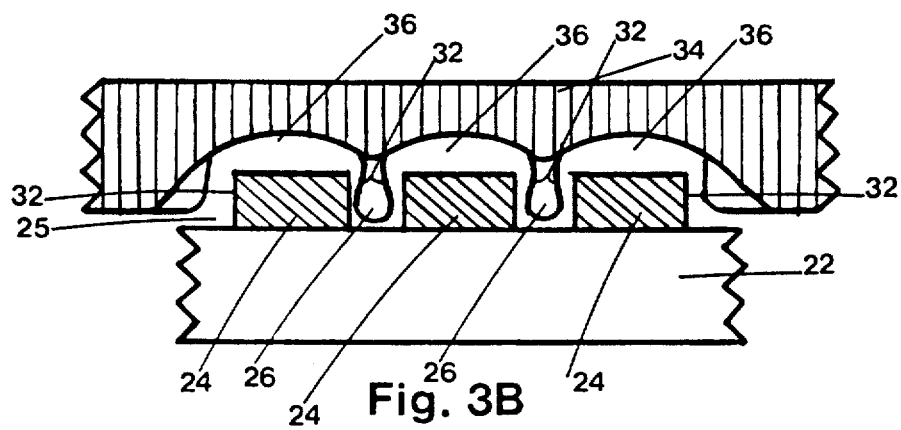

Next, as shown in FIG. 3B, the profile of the initial dielectric layer 25 is shaped using chemical mechanical planarization (CMP). Suitable (CMP) apparatus for shaping the initial dielectric layer 25 are well known in the art. One such suitable CMP apparatus is manufactured by Westech Engineering and is designated as a Model 372 Polisher. The CMP apparatus includes a rotatable polishing head (not shown) for holding the substrate 22 (e.g. wafer) and a rotatable polishing pad 34 for contacting the substrate 22. With such a polishing apparatus, the substrate 22 is held against the polishing pad 34 with a controlled pressure. A chemical slurry is metered onto the polishing pad 34 to provide chemical etchants and an abrasive medium. As an example, for oxide polishing, the chemical slurry may contain silica particles suspended in solution. Chemical slurries for other metals may include silicon carbide and diamond particles. In general, with such a CMP apparatus all process functions of the apparatus (e.g. rotational speed, force, temperature, slurry composition) are under computer control.

In the past, such a CMP apparatus has been utilized to provide a globally planar surface. With the method of the present invention, on the other hand, the CMP apparatus is operated to contour rather than just planarize the features of the semiconductor structure. In order to contour the dielectric layer 25, and as shown in FIG. 3B, the polishing pad 34 is soft enough to conform to the shape of the initial dielectric layer 25 to shape the topography (or profile) of the dielectric layer 25. Specifically, dielectric material is removed from the breadloaf area 36 on the top of the conducting lines 24. Further, the breadloaf area 36 is partially planarized by contact with the polishing pad 34. In addition, the polishing pad 34 extends into the gaps 26 between the conducting lines 24 and contacts the dielectric material on the sidewalls 32 of the conducting lines 24. This contact decreases the aspect ratio (depth/width) of the gaps 26 by widening the mouth of the gaps 26. The contact of the polishing pad 34 with the dielectric material also opens up the mouth of the gaps 26.

As previously stated, in order to conform to the shape of the initial dielectric layer 25, the polishing pad 34 must be formed of a relatively "soft" material. Although the characterization of the pad as soft is a matter of degree, in general the pad 34 must be soft enough to conform to the humps or breadloaf areas 36 of the initial dielectric layer 25 and flow into the gaps 26 between conducting lines 24, substantially as shown in FIG. 3B. Furthermore, "harder" soft polishing pads could be used to control the degree of contouring or shaping. Suitable soft polishing pads have an open pore structure and are formed of a felt based material impregnated with polyester urethane. One suitable type of polishing pad can be obtained from Rodel Products Corporation and is designated as a Polytex Supreme ®.

Figure 3C:
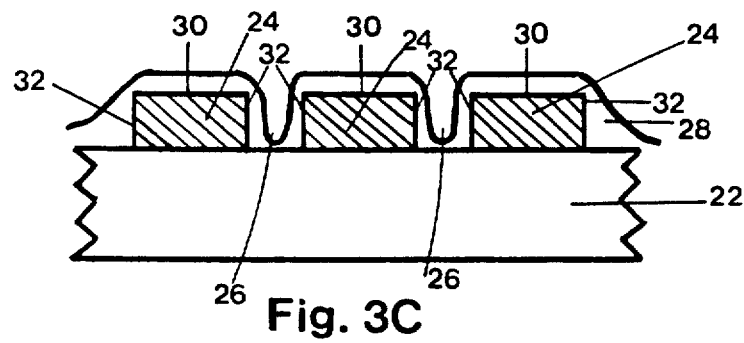

The contouring step illustrated in FIG. 3B is continued for a time period sufficient to planarize the bread loaf area 36 of the initial dielectric layer 25 and to remove dielectric material from the sidewalls 32 of the conducting lines 24 to open up the gaps 26. This forms a contoured dielectric layer 28 which is shown in FIG. 3C. As shown, the dielectric material on the top surface 30 of the conducting lines 24 is reduced in thickness and substantially planar. In addition, dielectric material has been removed from the sidewalls 32 of the conducting lines 24. The aspect ratio of the openings 26 has thus been reduced because the ratio of the depth/width of the gaps has been reduced. Furthermore, the mouth of the openings 26 has been opened up.

The CMP process, for forming the contoured dielectric layer 28, can be performed under process conditions and for a time period sufficient to achieve the contoured structure described. As an example, contouring of a 2000 to 6000 Å initially deposited TEOS based dielectric layer, deposited by standard CVD techniques can be performed using a Westech Model 372 polisher under the following process conditions.

| | |
|---|---|
| Time | 2 to 3 minutes |
| Pressure | 1 psi to 5 psi |
| Slurry composition | Silica based |
| Slurry rate | 20 milliliters per minute to 200 milliliters per minute |
| RPM | 5 to 50 |
| Polishing Pad | Rodel Polytex Supreme |
| Etch rate | 100 Å to 4000 Å/min. |

Following the formation of the contoured dielectric layer 28, the substrate 22 must be cleaned for the subsequent dielectric deposition process. Since the metal conducting lines 24 are protected by the contoured dielectric layer 28, the cleaning process must only accommodate one material.

Figure 3D:
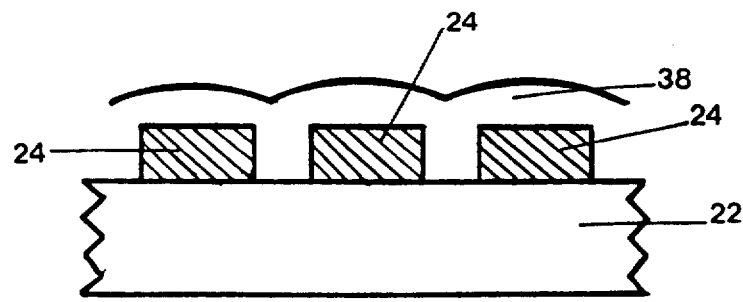

Following the cleaning procedure, additional dielectric material can be deposited over the contoured dielectric layer 28 using standard deposition techniques to provide a completed dielectric layer 38. This structure is shown in FIG. 3D. As shown, this completed dielectric layer 38 is substantially free of voids. This is because the topography of the contoured dielectric layer 28 makes it easier for additional dielectric material to be deposited into the gaps 26 to form the completed dielectric layer 38 without the inclusion of voids. Furthermore, the contoured dielectric layer 28 provides a substantially uniform topography and a substantially uniform surface chemistry for deposition of the additional dielectric material.

Following the deposition of the completed dielectric layer 38, a standard CMP planarizing step can be utilized to planarize the completed dielectric layer 38. In general, this final planarization step can be accomplished in a shorter period of time because the contoured dielectric layer 28 was already partially planarized. In addition, the completed dielectric layer 38 can be relatively thin because with the underlying contoured dielectric layer 28, there is less chance of punching through the completed dielectric layer 38 to the conducting lines 24 during the CMP planarization process.

Thus the method of the invention can be utilized in large scale semiconductor manufacture to form void free dielectric layers in an interlevel metallization scheme. Although the method of the invention has been described in an illustrative embodiment for forming a void free dielectric layer, however, it is to be understood that the method of the invention can be used in other semiconductor manufacturing processes. In the past CMP has been employed for the planarization of blanket films such that a resultant structure is globally planar. The method of the invention, on the other hand, can be used to round or enhance existing features of a semiconductor structure without achieving a total global planarity.

As such, the method of the present invention can be used on either blanket films or on patterned features of a semiconductor structure. Moreover the method of the invention can be used on either dielectric or conductive materials. Some additional specific applications of the present invention are as follows:

1. As a method to reduce the aspect ratio (height/width) of patterned step features by partially reducing the step height of the features or to reduce the aspect ratio of gap features by increasing the width of the gaps.
2. As a method for facet etching features.
3. As a method for making the gaps between features, particularly the mouths of the gaps, wider. When integrated into other etch or deposition processes this can make the filling or clearing of tight spaces easier. As an example, a profile of a deposited layer could be reshaped so that a subsequent etch step can be more efficiently performed. Such shaping/etching could be used to eliminate "stringers" which develop on the inside radius of some deposited layers.
4. As a method of preventing the strong electric fields associated with the sharp corners of conductors by rounding the edges of the conductors. The reduction of field intensity by this method will improve device reliability.
5. As a method of shaping a spin on glass (SOG) dielectric layer. With a SOG dielectric layer the deposition process is similar to the deposition of photoresist using a photoresist spinner followed by a hard bake of the photoresist. With an SOG process, a liquid dielectric glass material is spun onto the wafer (e.g. over conducting lines) and then hard baked. The method of the invention can be used to contour the profile of this initially deposited glass layer. A subsequent glass layer can then be deposited onto the contoured glass layer to complete the structure. With deposition of the glass upon a contoured profile the stresses in the SOG film will be decreased.

While the method of the invention has been described with reference to a preferred embodiment thereof, as will be apparent to those skilled in the art, certain changes and modifications can be made without departing from the scope of the invention as defined by the following claims.

What is claimed is:

1. In semiconductor manufacture, a method for forming a semiconductor structure, comprising:
   providing a semiconductor structure with patterned features formed on a substrate said features forming a topography;
   providing a chemical mechanical planarization apparatus having a polishing pad soft enough to conform to the topography of the features;
   rotating the substrate with respect to the polishing pad while holding the substrate against the polishing pad with a predetermined force;
   contouring and rounding the topography of the features by conforming a shape of the polishing pad to the features;
   controlling process parameters and continuing the contouring for a time period sufficient to achieve a desired topography for the features to facilitate a subsequent deposition onto the contoured topography; and
   depositing a layer of material over the contoured topography.

2. The method as claimed in claim 1 and wherein the polishing pad is formed a felt fiber material impregnated with polyurethane.

3. The method as claimed in claim 1 and wherein the method is used to contour the profile of a dielectric layer and then additional dielectric material is deposited onto the contoured dielectric layer.

4. The method as claimed in claim 1 and wherein the method is used to reduce an aspect ratio (height/width) of the features by partially reducing a step height of the features.

5. The method as claimed in claim 1 and wherein the method is used to open up and reduce an aspect ratio (depth/width) of a gap between the features by increasing a width of the gap relative to a depth.

6. The method as claimed in claim 1 and wherein the method is used to round a sharp corner of a conducting line.

7. The method as claimed in claim 1 and wherein the method is used to contour a spin on glass (SOG) dielectric layer for deposition of another layer of glass with less stress in the completed dielectric layer.

8. The method as claimed in claim 1 and wherein following contouring of the features an etch step is performed.

9. In semiconductor manufacture a method for forming a void free dielectric layer comprising:
   providing a semiconductor structure including a substrate and patterned conducting lines formed on the substrate with gaps formed between the conducting lines;
   conformally depositing a dielectric material over the conducting lines and into the gaps between the conducting lines to form an initial dielectric layer;
   contouring a topography of the initial dielectric layer by polishing the initial dielectric layer using chemical mechanical planarization (CMP) with a polishing pad soft enough to form the topography of the initial dielectric layer and removing dielectric material along a top surface and sidewalls of the conducting lines to form a contoured dielectric layer;
   controlling process parameters and continuing the contouring for a time period sufficient to achieve a desired topography for the contoured dielectric layer to facilitate a subsequent deposition of additional dielectric material; and
   depositing additional dielectric material over the contoured dielectric layer to form a completed dielectric layer without the inclusion of voids in the completed dielectric layer.

10. The method as claimed in claim 9 and wherein the polishing pad is formed of a felt fiber material impregnated with polyurethane.

11. The method as claimed in claim 9 and wherein an aspect ratio (depth/width) of the gaps is decreased during contouring and a mouth of the gaps is opened further.

12. The method as claimed in claim 9 and wherein the completed dielectric layer is deposited by chemical vapor deposition (CVD).

13. The method as claimed in claim 9 and wherein the completed dielectic layer is planarized using chemical mechanical planarization.

14. The method as claimed in claim 9 and wherein the completed dielectric layer is a spin on glass (SOG) dielectric.

15. The method as claimed in claim 14 and wherein the initial dielectric layer is deposited to a thickness of 2000–6000 angstroms.

16. The method as claimed in claim 15 and wherein the polishing pad is formed of a felt fiber material impregnated with blown polyurethane.

17. The method as claimed in claim 16 and wherein contouring of the initial dielectric layer is for a time period of about two to three minutes.

18. In semiconductor manufacture a method for forming and insulating interlevel conductors, comprising:

forming the conductors on a substrate with gaps between adjacent conductors;

depositing a dielectric material over the conductors and into the gaps between the conductors to form an initial dielectric layer;

contouring a topography of the initial dielectric layer by chemically mechanically planarizing the initial dielectric layer using a polishing pad adapted to conform to a topography of the initial dielectric layer to round the corners of the dielectric material and to remove dielectric material along a top surface and sidewalls of the conducting lines to form a contoured dielectric layer;

controlling process parameters and continuing the contouring for a time period sufficient to achieve a desired contoured topography for the contoured dielectric layer to facilitate a subsequent deposition of additional dielectric material;

cleaning the contoured dielectric layer and substrate;

depositing additional dielectric material over the contoured dielectric layer to form a completed dielectric layer that is free of voids; and planarizing the completed dielectric layer using chemical mechanical planarization.

* * * * *